(12) United States Patent
Suzuki

(10) Patent No.: US 7,242,846 B2
(45) Date of Patent: Jul. 10, 2007

(54) RECORDING APPARATUS

(75) Inventor: Toshihiko Suzuki, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 1157 days.

(21) Appl. No.: 10/217,046

(22) Filed: Aug. 12, 2002

(65) Prior Publication Data

US 2003/0039154 A1 Feb. 27, 2003

(30) Foreign Application Priority Data

Aug. 24, 2001 (JP) ............................. 2001-254784
Jul. 26, 2002 (JP) ............................. 2002-218527

(51) Int. Cl.
*H04N 5/76* (2006.01)
*H04N 7/00* (2006.01)
*H04N 5/00* (2006.01)

(52) U.S. Cl. ........................................ 386/46; 386/117
(58) Field of Classification Search .................. 386/46, 386/104, 107, 112, 117
See application file for complete search history.

(56) References Cited

U.S. PATENT DOCUMENTS 5,539,716 A * 7/1996 Furuhashi ..................... 386/99
6,259,859 B1 * 7/2001 Katsuki et al. ............. 386/104

FOREIGN PATENT DOCUMENTS

CN 1206174 A 1/1999

* cited by examiner

*Primary Examiner*—Thai Q. Tran
*Assistant Examiner*—Nigar Chowdhury
(74) *Attorney, Agent, or Firm*—Cowan, Liebowitz & Latman, P.C.

(57) ABSTRACT

A recording apparatus, wherein in a photographing mode in which image data and audio data obtained using a camera section and microphone, respectively, built into the apparatus are recorded, a head element is moved at a first speed corresponding to the photographing mode, and in an external input mode in which image data and audio data input by external sources are recorded, a head mechanism is moved at a second speed.

5 Claims, 17 Drawing Sheets

FIG. 5

| OPERATION MODE | SEEK OPERATION SETTING |
|---|---|
| IMAGE PICKUP SIGNAL RECORDING | SEEK PROFILE A |
| EXTERNAL INPUT SIGNAL RECORDING | SEEK PROFILE B |
| REPRODUCTION | |

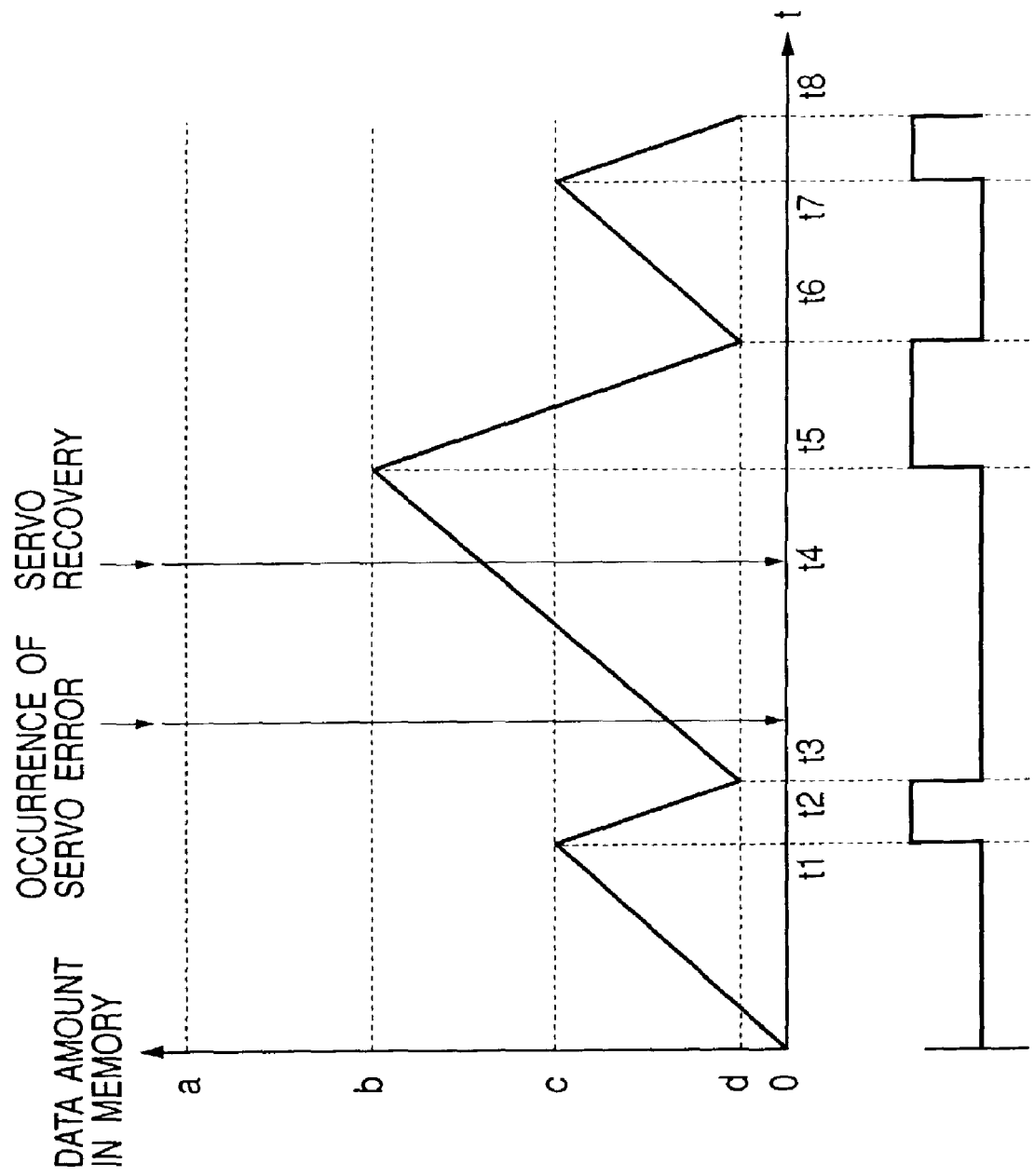

FIG. 15

| OPERATION MODE | SEEK OPERATION SETTING |
|---|---|
| MOVING IMAGE PHOTOGRAPHING MODE | SEEK PROFILE A |
| STILL IMAGE PHOTOGRAPHING MODE | SEEK PROFILE B |
| EXTERNAL INPUT SIGNAL RECORDING | |
| REPRODUCTION MODE | |

RECORDING APPARATUS

BACKGROUND OF THE INVENTION

1. Field of the Invention

The present invention relates to a recording apparatus, and in particular, to a device that records image and audio signals or the like on a disk-shaped recording medium.

2. Related Background Art

In recent years, the density and capacity of disk-shaped recording media have been increased rapidly. Accordingly, image pickup recording and reproducing apparatuses have been proposed which can record not only audio signals but also high-definition still images and motion pictures for a long-time reproduction on a disk-shaped recording medium and which can reproduce the recorded signals from the disk-shaped recording medium.

Further, since a size of the disk-shaped recording medium itself has been reduced, such an image pickup recording and reproducing apparatus has been miniaturized compared to conventional apparatuses using tape-shaped recording media. Such an image pickup recording and reproducing apparatus has also achieved a superior high-speed and random data access capability compared to apparatuses using tape-shaped recording media. Furthermore, the functions of the disk-shaped recording medium have been drastically improved; for example, the disk-shaped recording medium can be easily transported, is more reliable, requires reduced costs, and is more quickly responsive to retrieval operations.

With an apparatus using a disk-shaped recording medium of this kind, as a reduction in size, an increase in density, or the like are promoted as previously described, the density of the components packed in the apparatus increases. Thus, for example, a disk drive unit and a microphone unit for the disk-shaped recording medium may be located close to each other. In this case, during a recording operation performed on the disk-shaped recording medium, a mechanical operating sound from the disk drive may mix into a sound from the microphone as noise.

For example, if a recording operation is performed on a disk-shaped recording medium 900 which is shown in FIG. 17, the disk-shaped recording medium 900 has an inner circumferential recording area 901, a middle recording area 902, and an outer circumferential recording area 903 as shown in this drawing. It is assumed that data has been recorded only in the middle recording area 902, while no data has been recorded in the inner circumferential recording area 901 and outer circumferential recording area 903.

If signals are recorded in the unrecorded areas of the disk 900, it is contemplated that image and audio data may be continuously recorded in the inner circumferential recording area 901 and the outer circumferential recording area 903. In this case, since the unrecorded areas 901 and 903 are discontinuous on the disk 900, a disk drive causes a head to perform a seek operation. As a result, mechanical seek noise (hereinafter also simply referred to as "mechanical noise") may occur and mix into an audio signal from the microphone.

Then, to solve such a problem, Japanese Patent Application Laid-Open No. 2000-293965 has proposed an arrangement that cancels (reduces) noise by sampling assumed mechanical noise beforehand, storing the mechanical noise in a memory in a quasi-noise wave form, and subtracting and calculating the components of actual mechanical noise mixed into a sound from the microphone and the quasi-noise components stored in the memory.

However, the application of the arrangement described in Japanese Patent Application Laid-Open No. 2000-293965 still creates the following problems:

First, mechanical noise from the disk drive is attributed to non-periodic intermittent operations and it is a complicated combination of a disk rotation sound, a seek operation sound, or the like. That is, the tendency to generate the components of mechanical noise varies significantly with differences of the apparatus from other apparatuses of the same type, the internal mechanism of the apparatus, temporal changes therein, or the operating environment thereof.

Thus, the arrangement described in Japanese Patent Application Laid-Open No. 2000-293965 requires quasi-noise data of various patterns to be stored in a memory as quasi-noise. Consequently, a memory is required which can store an enormous amount of data.

Further, to detect and apply the pitch of complicated mechanical noise, a large-scale hardware configuration is required, which consumes more power. Furthermore, if the components of mechanical noise in itself generated vary owing to temporal changes or the like, this variation may not be compensated for.

SUMMARY OF THE INVENTION

The present invention is provided to solve the previously described problems. It is an object of the present invention to efficiently and steadily reduce intermittent mechanical noise that mixes into an audio signal from a microphone.

According to aspect of the present invention, due to such an object, there is provided a recording apparatus comprising:

image pickup means;

a microphone;

input means for receiving inputs of image data and audio data from an exterior of the apparatus;

recording means for recording the image data and audio data on a recording medium;

mode setting means for setting one of a plurality of modes including a first recording mode in which said recording means records, on said recording medium, image data obtained by said image pickup means and audio data obtained through said microphone and a second recording mode in which said recording means records, on said recording medium, the image data and audio data obtained by said input means; and control means for selecting one of a first control profile corresponding to said first recording mode and a second control profile corresponding to said second recording mode, according to the mode set by said mode setting means, and controlling a recording operation of said recording means on the basis of said selected control profile.

Other objects of the present invention and effects based thereon will be apparent from the following detailed description of embodiments of the present invention, taken in conjunction with the accompanying drawings.

BRIEF DESCRIPTION OF THE DRAWINGS

FIG. 5 is a table illustrating switching of the seek speed profile;

FIGS. 6A and 6B are diagrams illustrating a shock proof function of a video camera;

FIG. 15 is a table illustrating switching of a seek speed profile;

DESCRIPTION OF THE PREFERRED EMBODIMENTS

Embodiments of the present invention will be described below with reference to the drawings.

First Embodiment

Figure 1:
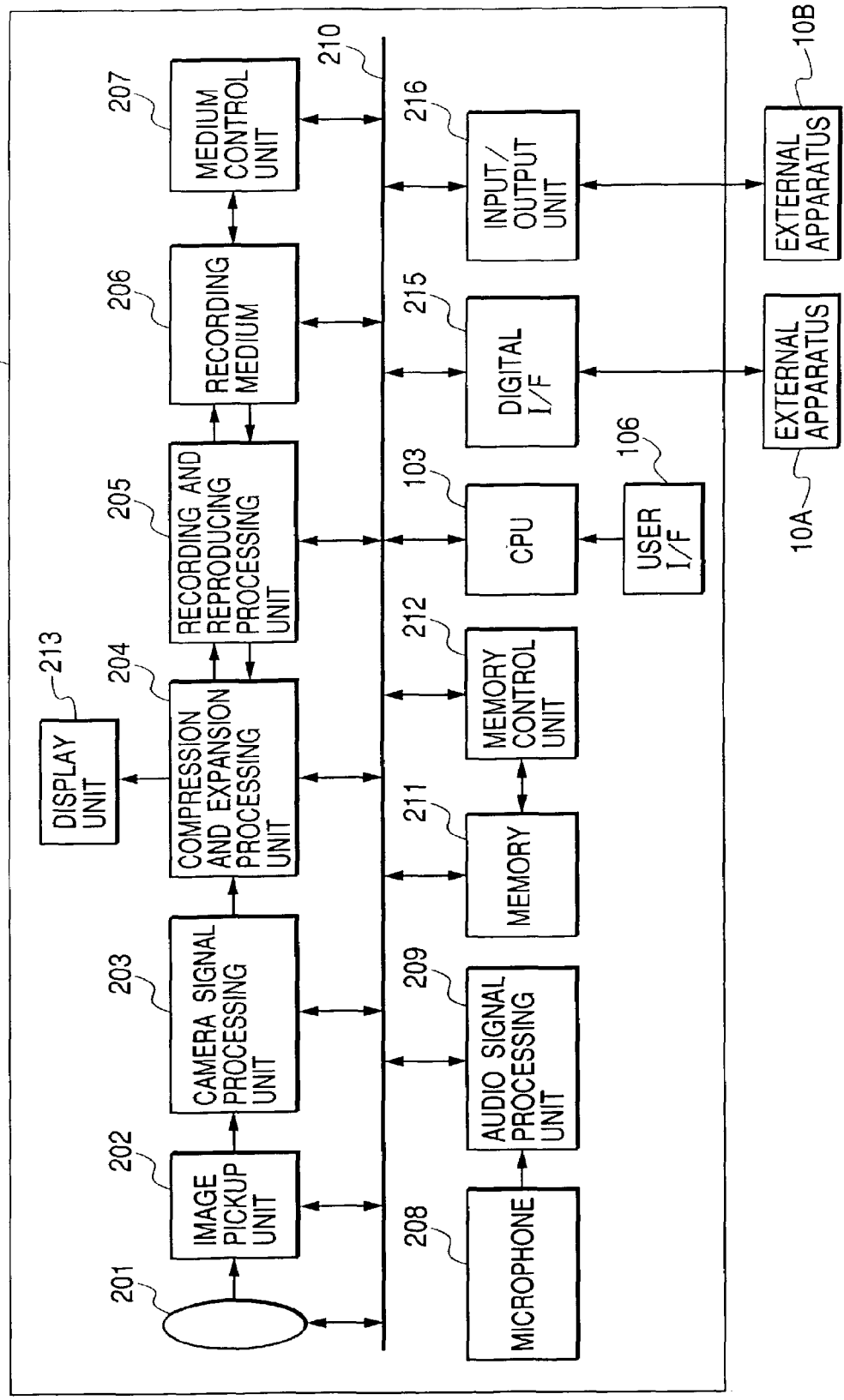
FIG. 1 is a block diagram showing a configuration of a video camera to which the present invention is applied.

The present invention is applied to, for example, a video camera 100, shown in FIG. 1.

General Configuration of Video Camera 100 and Series of Operation thereof

The video camera 100 comprises an optical unit 201 composed of a group of optical system lenses and an iris and including an optical control system for focusing, zooming, or the like; an image pickup unit 202 including an image pickup element such as a CCD; a camera signal processing unit 203; a compression/expansion processing unit 204; a recording and reproduction processing unit 205; a recording medium 206; a medium control unit 207; a display unit 213; a memory 211; a memory control unit 212; a CPU 103; a user I/F 106; a digital I/F 215; a microphone 208; an audio signal processing unit 209; and an input/output unit 216, as shown in FIG. 1.

Further, the image pickup unit 202, the camera signal processing unit 203, the compression/expansion processing unit 204, the recording and reproduction processing unit 205, the medium control unit 207, the memory 211, the memory control unit 212, the CPU 103, the user I/F 106, the digital I/F 215, and the audio signal processing unit 209 are connected via a data bus 210 so as to communicate data with one another, respectively.

In this video camera 100, the memory 211 is used by the functional blocks via the data bus 210 in a time sharing manner, and is controlled and managed by the memory control unit 212.

The CPU 103 is a central processing unit that unifies and controls the entire image pickup recording and reproducing apparatus 100 by execution of predetermined programs or the like. The user I/F 106 has various operation keys and has a function of instructing the CPU 103 on an operation on the basis of a key operation performed by a used. The digital I/F 215 transmits and receives signals according to standards such as the IEEE 1394 and USB (Universal Serial Bus).

For example, if the user I/F 106 instructs the CPU 103 on an image pickup operation and a recording operation, brightness, angle of view, focus, or the like of light from an object (not shown) are controlled by the optical unit 201. The resulting optical signal is input to the image pickup unit 202.

The image pickup unit 202 converts the input optical signal into an electric signal and outputs it to the camera signal processing unit 203. The camera signal processing section 203 samples and holds the electric signal and converts it into a digital image signal. This image signal is subjected to signal processing such as color separation, gradation correction, and white balance adjustment. Then, the processed signal is output. The audio signal processing unit 209 controls the gain of an audio signal input by the microphone 208, to a predetermined level for digitization. The resultant audio signal is output as audio data.

The compression/expansion processing unit 204 compressively encodes the image data output by the camera signal processing unit 203 and the audio data output by the audio signal processing unit 209, according to a predetermined compressive encoding method. The display unit 213 displays the image pickup data compressively encoded by the compression/expansion processing unit 204, on a monitor such as an LCD. Further, the display unit 213 displays the operational status of the video camera 100 or the like as on screen display information.

The recording and reproduction processing unit 205 subjects compressively encoded data obtained by the compression/expansion processing unit 204 to an error correction encoding process, a modulating process, or the like using parity data for the recording medium 206. The recording and reproduction processing unit 205 further adds data such as synchronization and an ID to the processed data to convert it into a form suitable for recording. The recording and reproduction processing unit 205 then records the resultant data on the recording medium 206. In this case, the medium control section 207 controls rotation of the recording medium, seeking of the head, or the like.

On the other hand, if a reproducing operation is instructed by the user I/F 106, the recording and reproduction processing unit 205 detects original digital data in data read from the recording medium 206, and subjects this data to error correction, demodulation, or the like. Further, a PLL circuit is used to generate clocks that synchronize with this reproduced data.

The compression/expansion processing unit 204 subjects the data output by the recording and reproduction processing unit 205 to an expansion process corresponding to a predetermined compressive encoding method, to obtain image pickup data and audio data before compressive encoding. The display unit 213 displays image pickup data obtained by the compression/expansion processing unit 204 on the LCD or the like.

Further, if the user I/F 106 instructs the CPU 103 to record input data from the digital I/F 215, the CPU 103 uses the digital I/F 215 to receive image or audio data from an external apparatus 10A in a digital signal form and to transmit the data to the recording and reproduction processing unit 205. In this case, it is assumed that the image and audio data from the external apparatus 10A have already been encoded. The recording and reproduction processing unit 205 subjects this input data to required processes as previously described and then records it on the recording medium 206.

Further, if the user I/F 106 instructs the CPU 103 to record an input signal from the input/output unit 216, the CPU 103 controls the input/output unit 216 to receive an image and audio signals output by an external apparatus 10B. The input/output unit 216 converts the image or audio signal output by the external apparatus 10B into digital data respectively, and then outputs the obtained data to the memory 211. The CPU 103 outputs the image and audio data stored in the memory 211 to the compression/expansion processing unit 204 for compressive encoding. The compression/expansion processing unit 204 then transmits the compressively encoded data to the recording and reproduction processing unit 205. The recording and reproduction processing unit 205 subjects this compressively encoded data to required processes as previously described and then records it on the recording medium 206.

Figure 2:
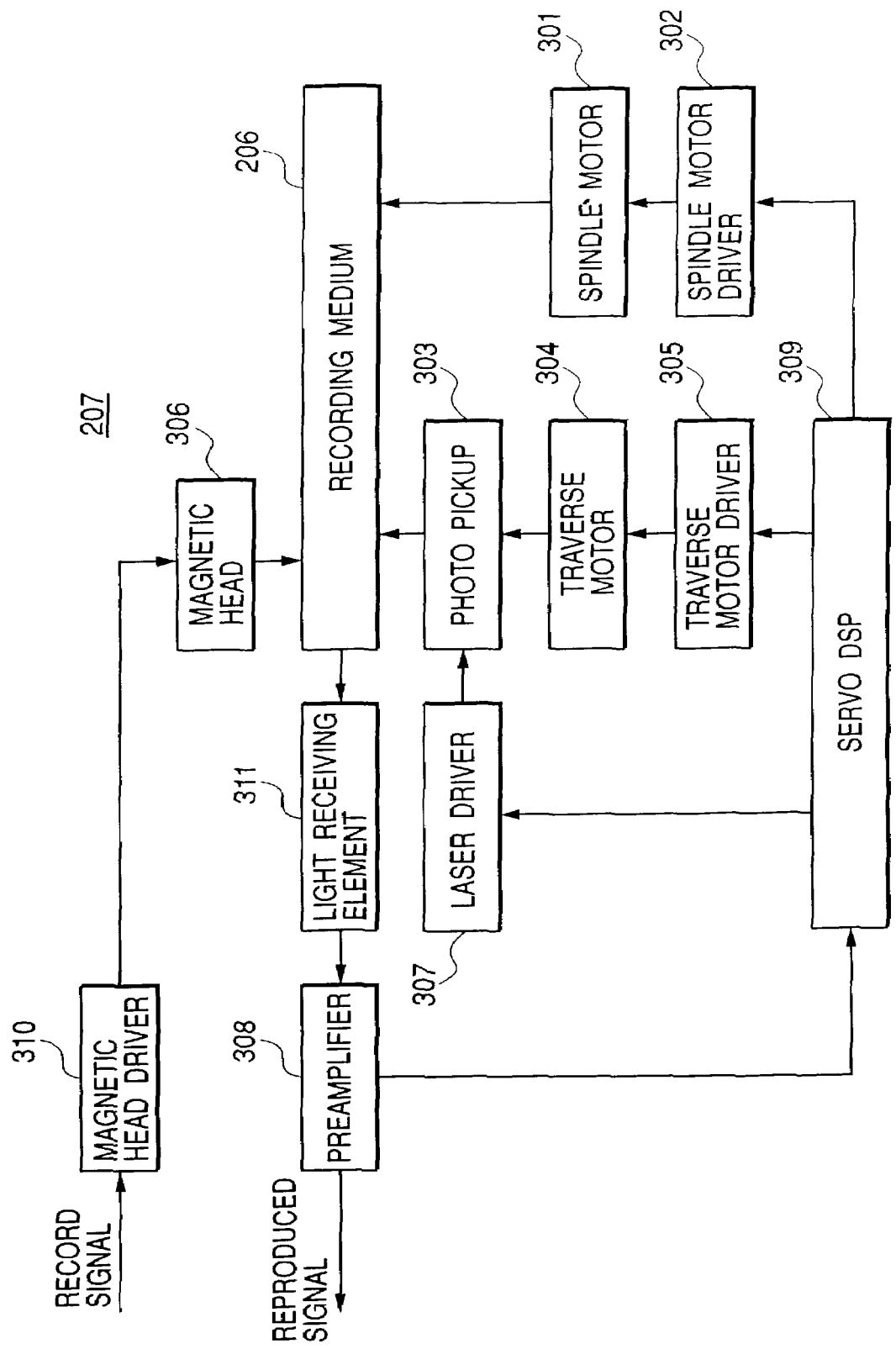
FIG. 2 is a block diagram showing a configuration of a medium control section.

Specific Configurations of Recording Medium 206 and Medium Control Section 207 and Series of Operations FIG. 2 is a diagram specifically showing the configurations of the recording medium 206 and medium control section 207. The recording medium 206 is a disk-shaped recording medium such as an optical magnetic disk.

The medium control unit 207 functions as a disk drive, and comprises a spindle motor 301, a spindle motor driver 302, a traverse motor 304, a traverse motor driver 305, a servo DSP (Digital Signal Processor) 309, an optical pickup 303, a laser driver 307, a magnetic head 306, a magnetic head driver 310, and a preamplifier 308, as shown in FIG. 2.

In the medium control section 207, the servo DSP 309 controls the spindle motor 301 via the spindle motor driver 302, and thereby predetermined rotation servo is applied to the recording medium 206 (hereafter referred to as disk medium). And, the traverse motor 304 is drived and controlled via the traverse motor driver 305, and thereby the optical pickup 303 is traced to a predetermined track on the disk medium 206. Further, the servo DSP 309 controls an actuator for the optical pickup 303 for focus control or tracking control.

To reproduce data from the disk medium 206, the laser driver 307 applies a light beam of predetermined power to the disk medium 206 to detect the quantity of light reflected by the disk medium 206. Then, this reflected beam is received by the light receiving element 311 and converted into an electric signal to obtain a reproduced electric signal corresponding to the reflected beam. This beam is then output to the preamplifier 308.

The preamplifier 308 amplifies the reproduced electric signal to a predetermined signal level and subjects the amplified signal to a matrix operation process or the like before output. An output signal from the preamplifier 308 is supplied to the recording and reproduction processing unit 205, shown in FIG. 1.

To record data on the disk medium 206, the laser driver 307 controls the pickup 303 to pulse-modulate and apply a light beam of predetermined power to the disk medium 206. At the same time, the magnetic head driver 310 drives the magnetic head 306 on the basis of the data (recording modulated signal) from the recording and reproduction processing unit 205 shown in FIG. 1 to apply recording modulated magnetic fields to the recording medium 206, thereby recording magnetic information thereon.

Seek Operation of Video Camera 100

Figure 3:
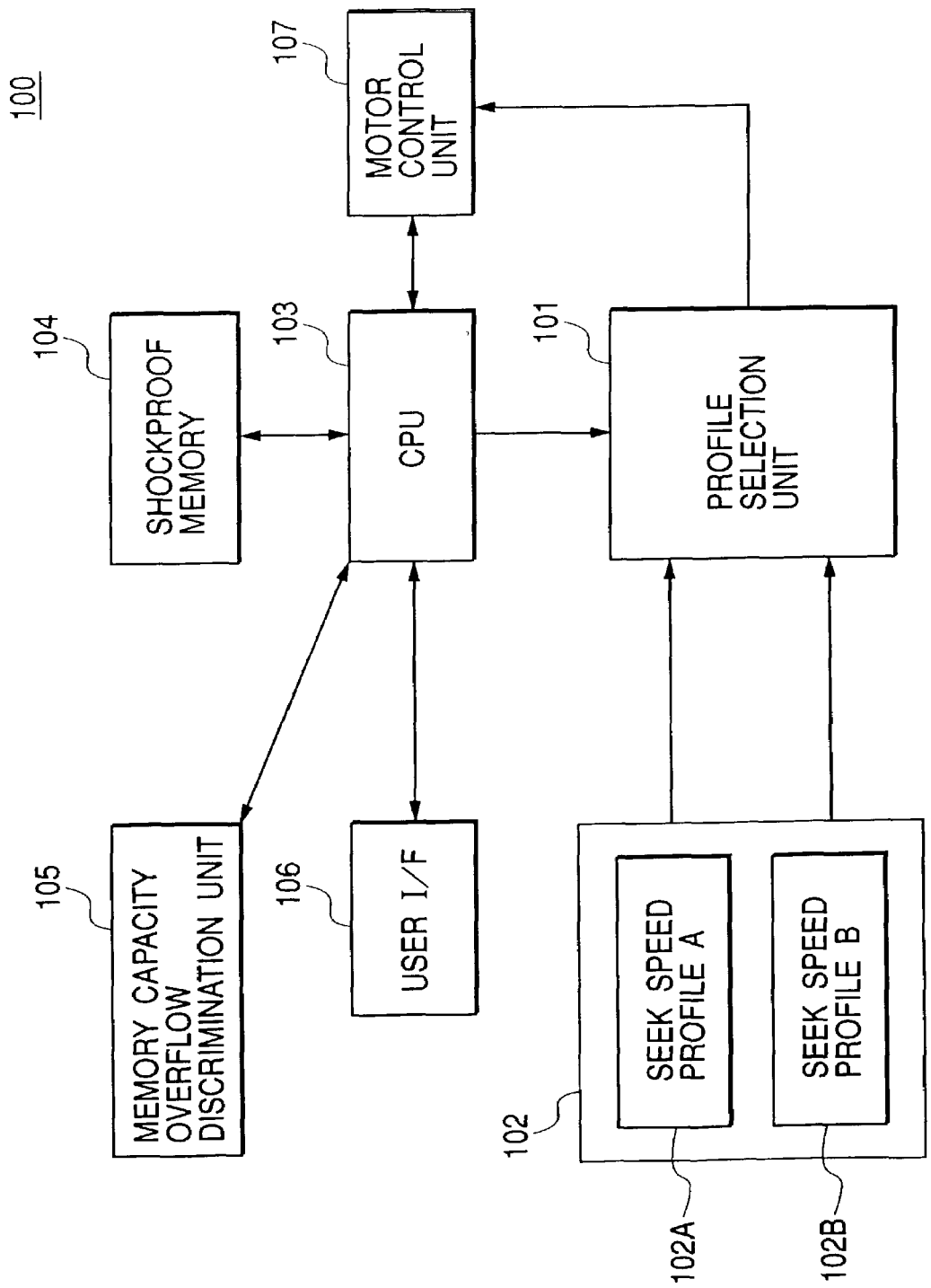
FIG. 3 is a block diagram showing a main functional configuration of the video camera.

FIG. 3 is a diagram showing the functional configuration of the video camera 100 wherein a function of the video camera 100 which is used to allow the medium control unit 207 to perform a seek operation.

The video camera 100 comprises the user I/F 106 and CPU 103, shown in FIG. 1, a profile selection unit 101, a profile storage unit 102 that stores seek speed profiles 102A and 102B, a shock proof memory 104, a memory capacity determination unit 105, and a motor control unit 107 (corresponding to the medium control unit 207) as shown in FIG. 3.

The seek speed profiles 102A and 102B are respectively used as disk drive control profiles implemented by the motor control section 107 to cause the traverse motor 304 to slidably drive the optical pickup.

Figure 4:
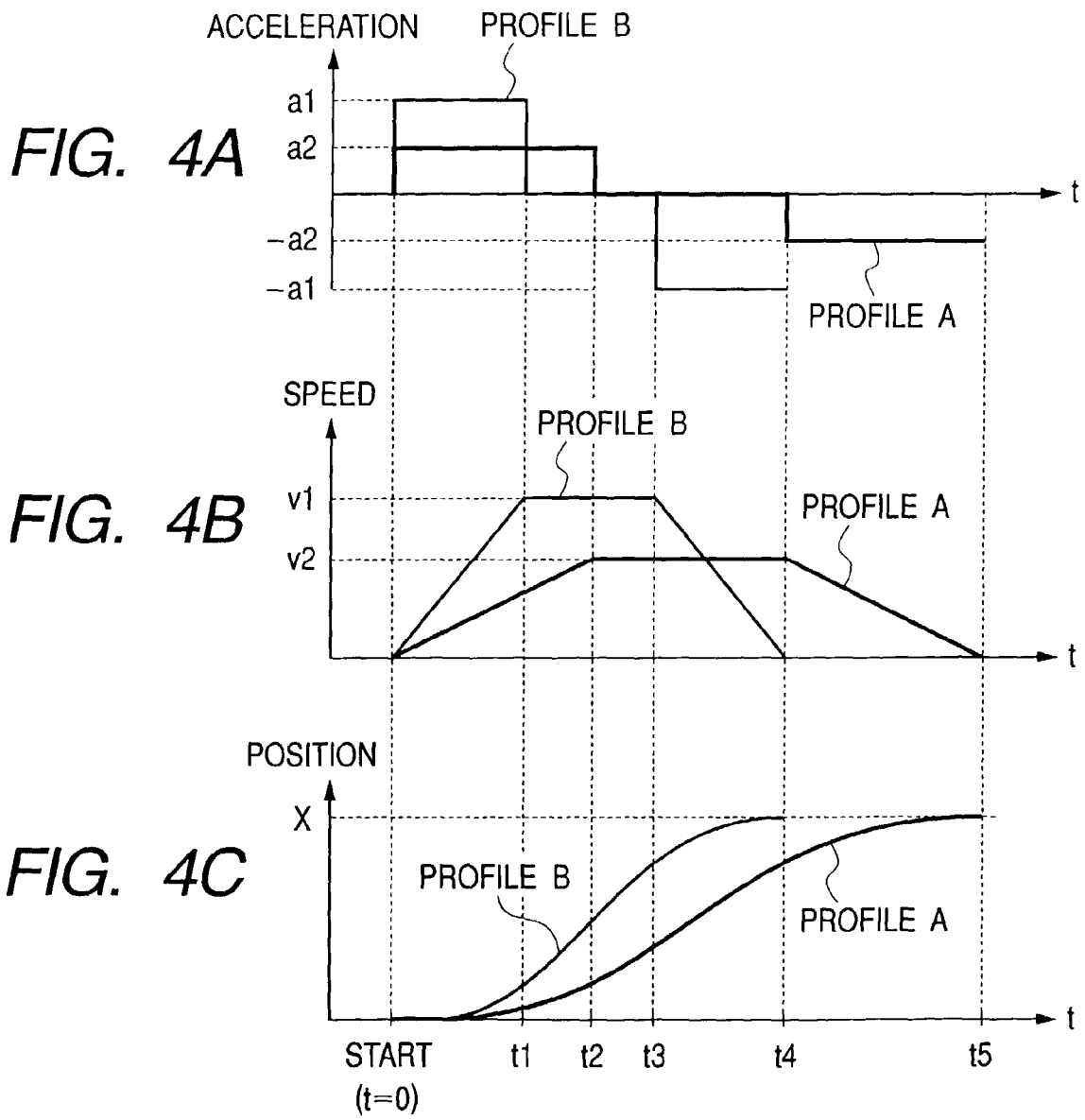
FIGS. 4A, 4B, and 4C are diagrams illustrating a seek speed profile.

FIGS. 4A to 4C are diagrams showing variations in acceleration (see FIG. 4A), speed (see FIG. 4B), and position (see FIG. 4C) in a seek operation to a target position X on the disk medium 206 for the seek speed profiles 102A and 102B.

The seek speed profile 102A (profile A) is shown by the thick solid line in FIGS. 4A to 4C, and exhibits an acceleration a2 in a time period from t=0 to t=2 (see FIG. 4A), a fixed speed v2 in a time period from t2 to t4 (see FIG. 4B), and an acceleration −a2 in a time period from t4 to t5 (see FIG. 4C).

On the other hand, the seek speed profile 102B (profile B) is shown by the thin solid line in FIGS. 4A to 4C, and exhibits an acceleration a1 in a time period from t=0 to t=1 (see FIG. 4A), a fixed speed v1 in a time period from t1 to t3 (see FIG. 4B), and an acceleration −a1 in a time period from t3 to t4 (see FIG. 4C).

In this manner, the seek speed profile 102A exhibits a slower seek operation than the seek speed profile 102B.

The profile selection unit 101 has a function of switching a control profile to one of the seek speed profiles 102A and 102B depending on the operation mode of the video camera 100.

FIG. 5 is a table used by the profile selection unit 101 to switch between the seek speed profiles 102A and 102B. That is, on the basis of the table in FIG. 5, the profile selection unit 101 selects the seek speed profile 102A when recording image data photographed using the video camera 100 and audio data obtained through the microphone 208. On the other hand, the profile selection unit 101 selects the seek speed profile 102B when recording externally input data, i.e. recording an image and audio signals from the external apparatus, input by the digital I/F 215 or input/output unit 216.

The shock proof memory 104 is provided for the following reason:

With the video camera 100 using the disk medium 206, during a recording operation, the disk servo may be removed because of shaking, vibration, impact, or the like effected on the enclosure. To prevent this, the video camera 100 comprises the shock proof memory 104.

FIGS. 6A and 6B are diagrams showing a write and read of data to and from the shock proof memory 104.

In FIG. 6A, the axis of abscissas indicates a time t, while the axis of ordinates indicates the amount of data stored in the memory. As shown in FIG. 6A, in a time period from t0 to t1, compressed data to be recorded is stored in the shock proof memory 104. Further, in a time period from t1 to t2, to write the stored recorded data in the disk medium 206, data corresponding to a data amount c is read from the shock proof memory 104.

The timings with which data is read from the shock proof memory 104 are shown in FIG. 6B. For example, it is assumed that at time t3, an external impact is effected to cause a servo error. In this case, data continues to be stored in the shock proof memory 104 till time t4 at which the servo is recovered. Data corresponding to a data amount b is stored till time t5 at which seeking of a predetermined track on the disk medium 206 and a positional control and recording standby operations are completed. Then, in a time period from t5 to t6, the stored recorded data is read from the shock proof memory 104 and recorded on the disk medium 206.

In FIGS. 6A and 6B, the data amount a is slightly smaller than the maximum capacity of the memory 104 and is used to determine whether or not the memory 104 will overflow, as described later.

Thus, the shock proof memory 104 has a necessary and sufficient memory capacity and can attain recovery from an external shock or the like by intermittently reading therefrom data to be recorded.

Figures 7A, 7B, 7C:
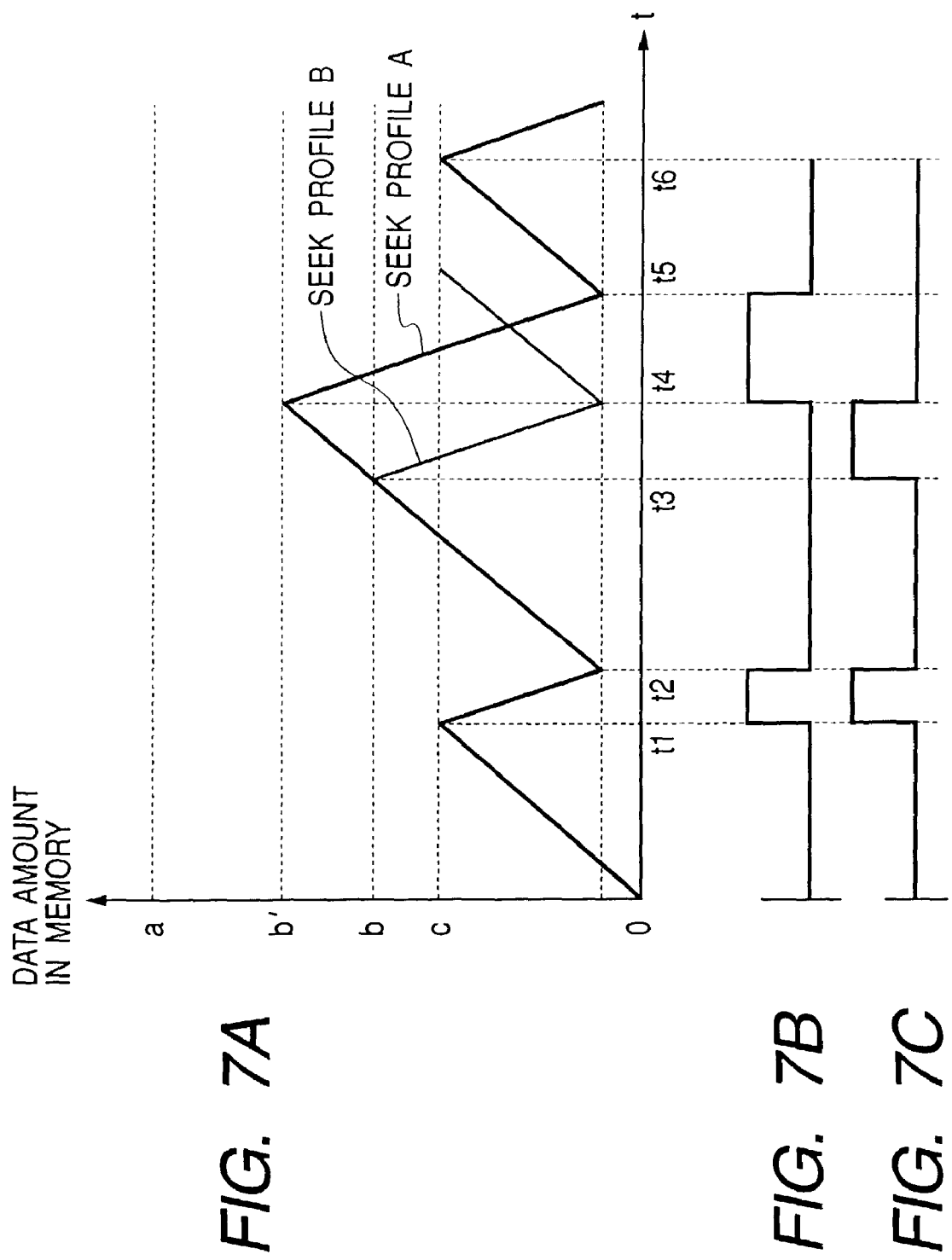
FIGS. 7A, 7B, and 7C are diagrams illustrating a read of data from a shock proof memory.

FIGS. 7A to 7C show changes in the control of the shock proof memory 104 wherein the seek speed profiles 102A and 102B are applied.

In FIG. 7A, the axis of abscissas indicates a time (t), whereas the axis of ordinates indicates the amount of data stored in the memory 104. As shown in FIG. 7A, in a time period from t0 to t1, compressed data to be recorded is sequentially stored in the shock proof memory 104. Further, in a time period from t1 to t2, to write the stored recorded data in the disk medium 206, data corresponding to the data amount c is read from the shock proof memory 104.

Here, in FIG. 7A, the thick solid line indicates changes in the seek speed profile 102A in the memory, whereas the thin solid line indicates changes in the seek speed profile 102B in the memory.

FIG. 7B shows the timings at which data is read from the shock proof memory 104 according to the seek speed profile 102A. FIG. 7C shows the timings at which data is read from the shock proof memory 104 according to the seek speed profile 102B.

If a seek operation is started in a time period from t2 to t3, then according to the seek speed profile 102B, the seek operation is completed at time t3. Then, the recorded data is read from the shock proof memory 104. In this case, the amount of data stored in the memory is b. On the other hand, according to the seek speed profile 102A, the seek operation is completed at time t4. Then, the recorded data is read from the shock proof memory 104. In this case, the amount of data stored in the memory is b', which is larger than b.

In this manner, the timings at which data is read from the shock proof memory 104 during a seek operation depends on the seek profile. In this regard, the memory capacity overflow determination unit 105 sequentially monitors the amount of data stored in the shock proof memory 104. On the basis of this monitored output, the CPU 103 controls write and read operations performed on the memory 104 so as to prevent the shock proof memory 104 from overflowing even if the low-speed driving seek profile is applied.

Now, the control operation of the CPU 103 will be described with reference to a flow chart.

Figure 8:
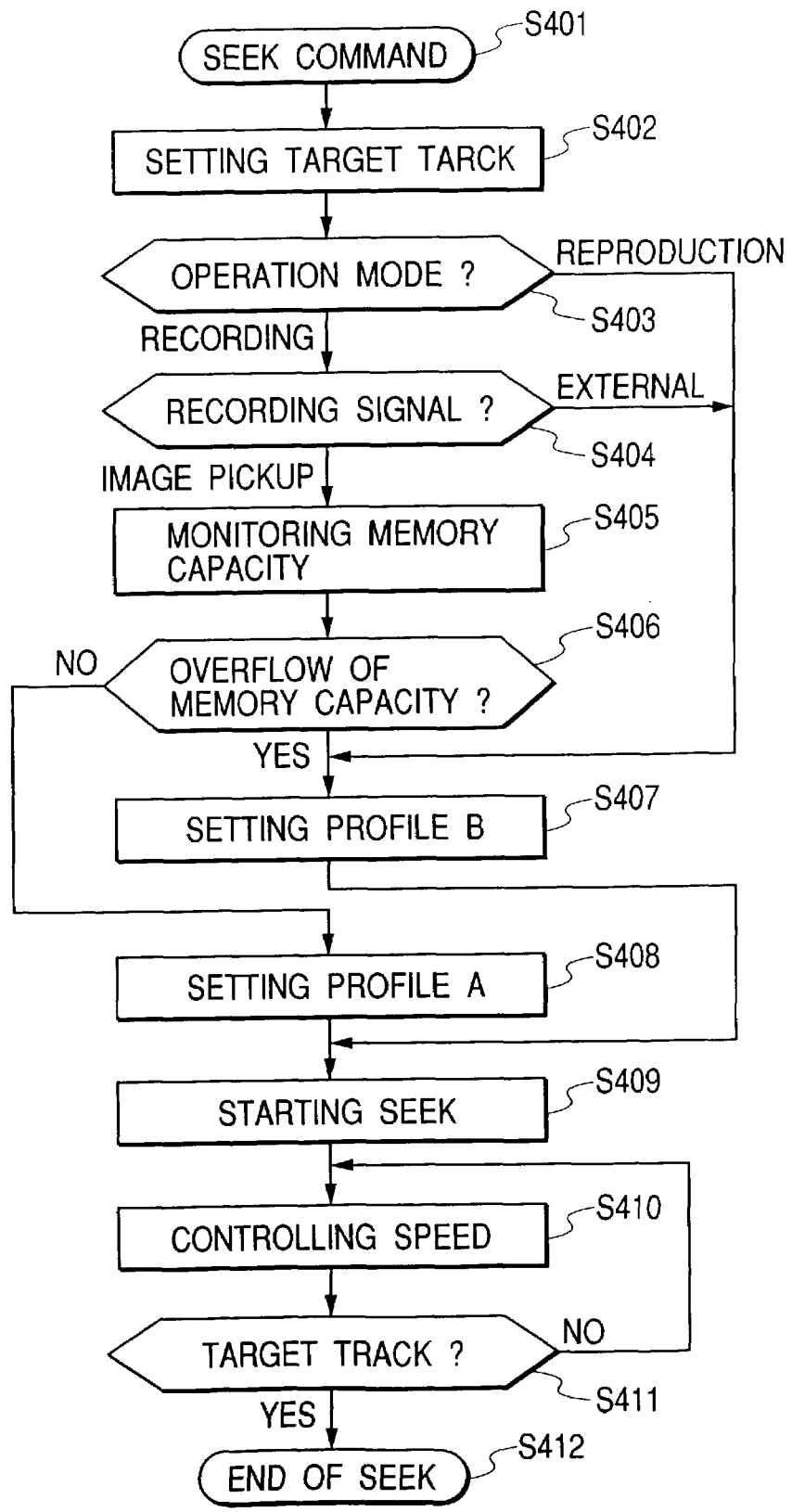
FIG. 8 is a flow chart illustrating an operation of the video camera.

FIG. 8 is a flow chart showing a seek operation of the video camera 100.

Steps S401 to S403:

When provided with a seek operation command (step S401), the CPU 103 sets a target track on the disk medium 206 (step S402), and subsequently determines an operation mode (step S403).

If it is determined at step S403 that the operation mode is a recording mode, the process proceeds to step S404. If the operation mode is a reproduction mode, the process proceeds to step S407.

Step S404:

If it is determined at step S403 that the operation mode is the recording mode, the CPU 103 determines whether or not data to be recorded is image data photographed using the video camera 100 or has been obtained through the microphone 208.

If it is determined at step S404 that the data to be recorded has been obtained using the video camera 100, then the process proceeds to step S405. If the data to be recorded has been externally input, then the process proceeds to step S407.

Step S405:

If it is determined at step S404 that the data to be recorded has been obtained using the video camera 100, then the memory capacity overflow determination unit 105 monitors the storage capacity of the shock proof memory 104.

Step S406:

If the memory capacity overflow determination unit 105 determines, by the monitoring operation at step S405, whether or not the shock proof memory 104 is overflowing, i.e. the amount of data stored in the memory 104 exceeds the data amount a, shown in FIGS. 6A and 6B. If it is determined at step S406 that the data amount a is exceeded, i.e. the shock proof memory 104 is overflowing, then the process proceeds to step S407. Otherwise, the process proceeds to step S409.

Step S407:

If it is determined at step S403 that the operation mode is the reproduction mode or it is determined at step S404 that the data to be recorded has been externally input or it is determined at step S406 that the shock proof memory 104 is overflowing, then the profile selection unit 101 selects and sets the seek speed profile 102B. The profile B is a high-speed seek profile.

After step S407, the process proceeds to step S409.

Step S408:

If it is determined at step S406 that the shock proof memory 104 is not overflowing, i.e. the amount of data stored in the memory 104 is equal to or smaller than the predetermined capacity, the profile selection unit 101 selects and sets the seek speed profile 102A. The profile A is a low-speed seek profile.

After step S408, the process proceeds to step S409.

Steps S409 to S412:

Once the seek profile is set after step S407 or S408, the motor control unit 107 starts a seek operation. The motor control unit 107 controls the speed of the disk medium 206 and checks whether or not the target track set at step S402 is reached, until the target track is actually reached. Subsequently, the seek operation is completed.

The "seek" in this case refers to rough seek in which the entire optical pickup 303 moves over a track in the disk medium 206. In general, the seek is defined as an operation performed until the final target track is reached on the disk medium 206. The seek operation is a combination of a rough seek operation performed by a coarse-adjustment motor system and fine-tuning of an objective lens executed by an actuator in the optical pickup. However, the target track can be reached even with only a rough seek operation, so that the rough seek is simply referred to as "seek" herein.

Thus, in this embodiment, the two seek profiles for different seek speeds are provided so that in the photographing mode in which image data picked up by the image pickup unit and audio data from the microphone 208 associated with the image data are simultaneously recorded, a seek operation using the lower-speed seek profile is performed. As a result, noise from the motor can be reduced during seeking.

This reduces noise from the motor which may mix into a sound from the microphone.

Further, in the mode in which no sounds from the microphone are recorded, such as the externally input mode in which external image and audio data are recorded, or the reproduction mode, since the noise of the motor is not recorded a seek operation is performed using the high-speed seek profile. Thus, a prompt seek operation can be accomplished.

In particular, if image and audio data from the external apparatuses are input and recorded, the high-speed seek profile can be used to dub the data from the external apparatuses at a high speed.

Second Embodiment

Figure 9:
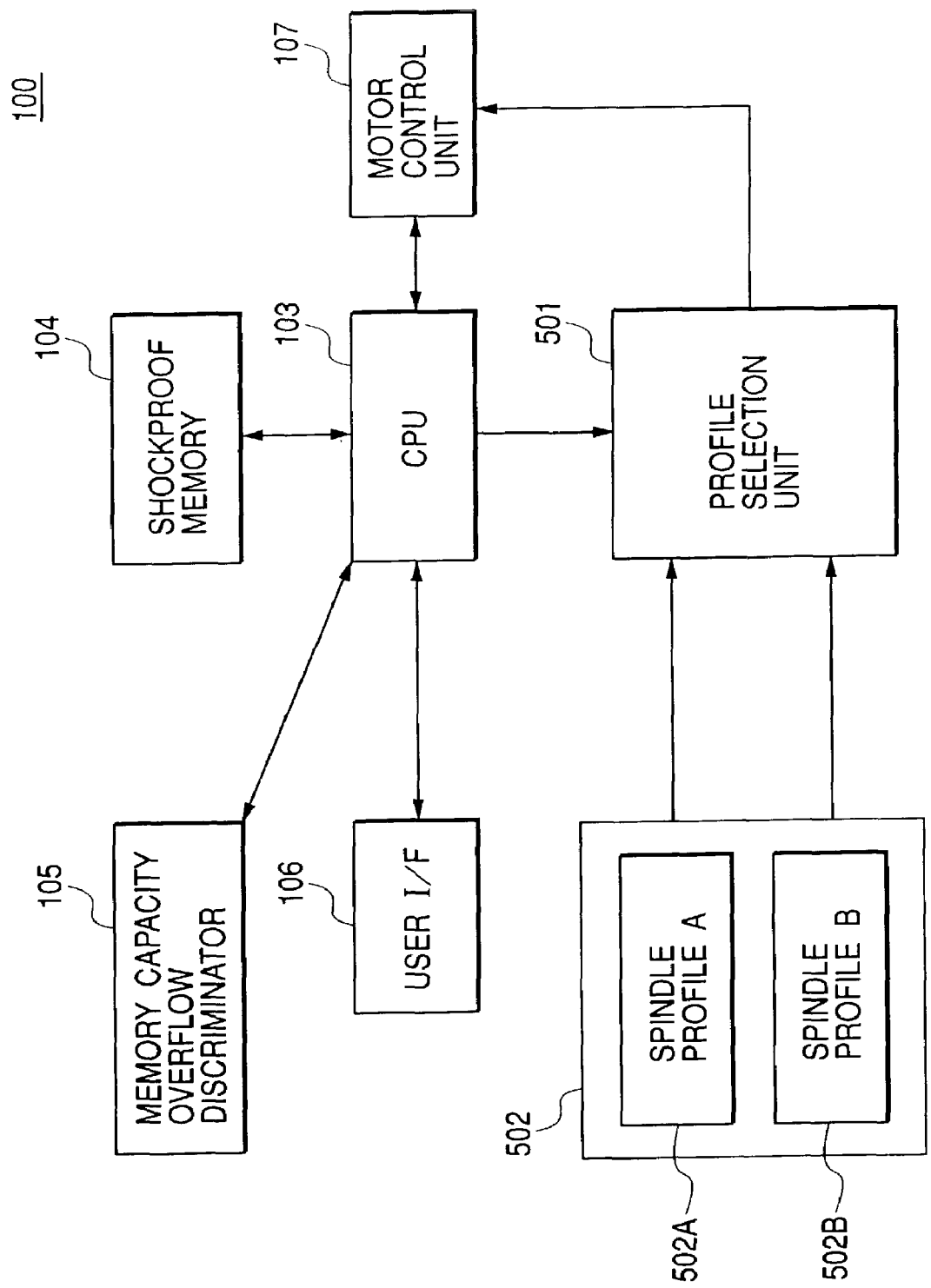
FIG. 9 is a block diagram showing a main functional configuration of the video camera.

In the video camera 100 of this embodiment, the main functional arrangements for spindle operations are as shown in FIG. 9.

In this embodiment, the video camera 100 comprises the user I/F 106 and CPU 103, similarly to the configuration shown in FIG. 3, as well as a profile selection unit 501, a profile storage unit 502 that stores spindle speed profiles 502A and 502B, a memory 504, and a motor control unit 507 (corresponding to the medium control unit 207 in FIG. 1).

The spindle speed profiles 502A and 502B are used as disk drive control profiles implemented by the motor control unit 107 to control rotation of the spindle motor (spindle control) respectively.

Figures 10A, 10B, 10C:
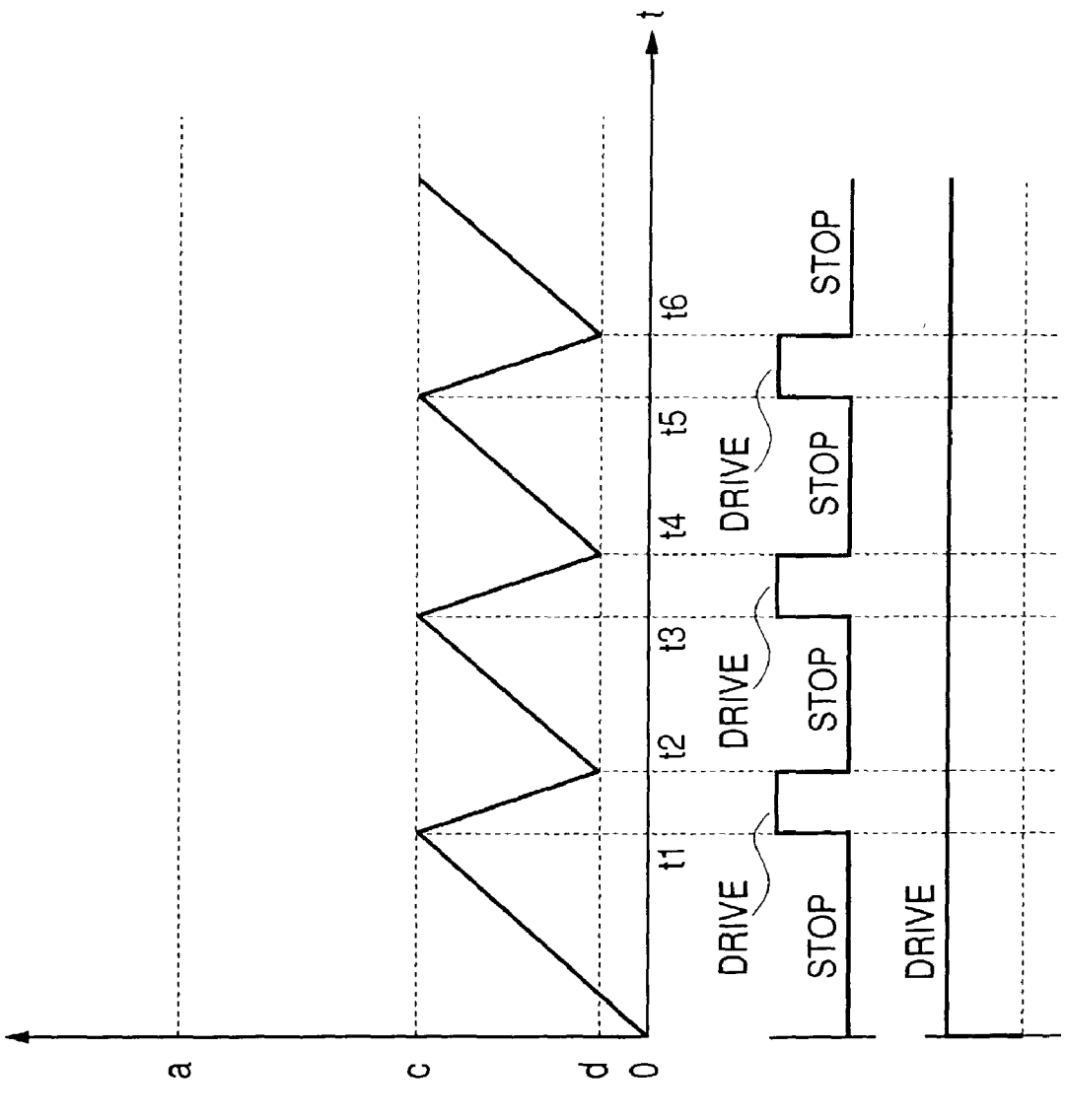
FIGS. 10A, 10B, and 10C are diagrams illustrating a spindle speed profile.

FIG. 10A is a diagram showing timings with which data stored in the shock proof memory 104 is loaded into the disk medium 206 on the basis of the control of the spindle motor of the disk medium 207 by the motor control unit 507. Further, FIG. 10B is a diagram showing how the spindle is controlled according to the spindle speed profile 502B. FIG. 10C is a diagram showing how the spindle is controlled according to the spindle speed profile 502A.

As shown in FIG. 10A, data is loaded from the shock proof memory 104 into the disk medium 206 as follows: in a time period from t0 to t1, compressed image and audio data are stored in the shock proof memory 104. In a time period from t1 to t2, recorded data stored in the shock proof memory 104 is read and recorded on the disk medium 206.

As shown in FIG. 10B, the spindle is controlled according to the spindle speed profile 502B as follows: in a time period from t0 to t1, the spindle motor is stopped. At time t1, the spindle motor is controlled to attain a predetermined rotation speed. In a time period from t1 to t2, the spindle motor is driven to record data on the disk medium 206. Once the data is completely recorded, the spindle motor is stopped again in a time period from t2 to t3. Then, in a time period from t3 to t4, the spindle motor is driven again so as to operate at a predetermined rotation speed. Thus, the spindle speed profile 502B realizes what is called intermittent spindle driving control.

In contrast, as shown in FIG. 10C, when the spindle is controlled according to the spindle speed profile 502A, the spindle motor is controlled to attain a predetermined rotation number from time t0 and is then continuously rotationally driven. Thus, the spindle speed profile 502A is a spindle continuous driving profile.

Then, a spindle control process executed by the CPU 103 will be described.

Figure 11:
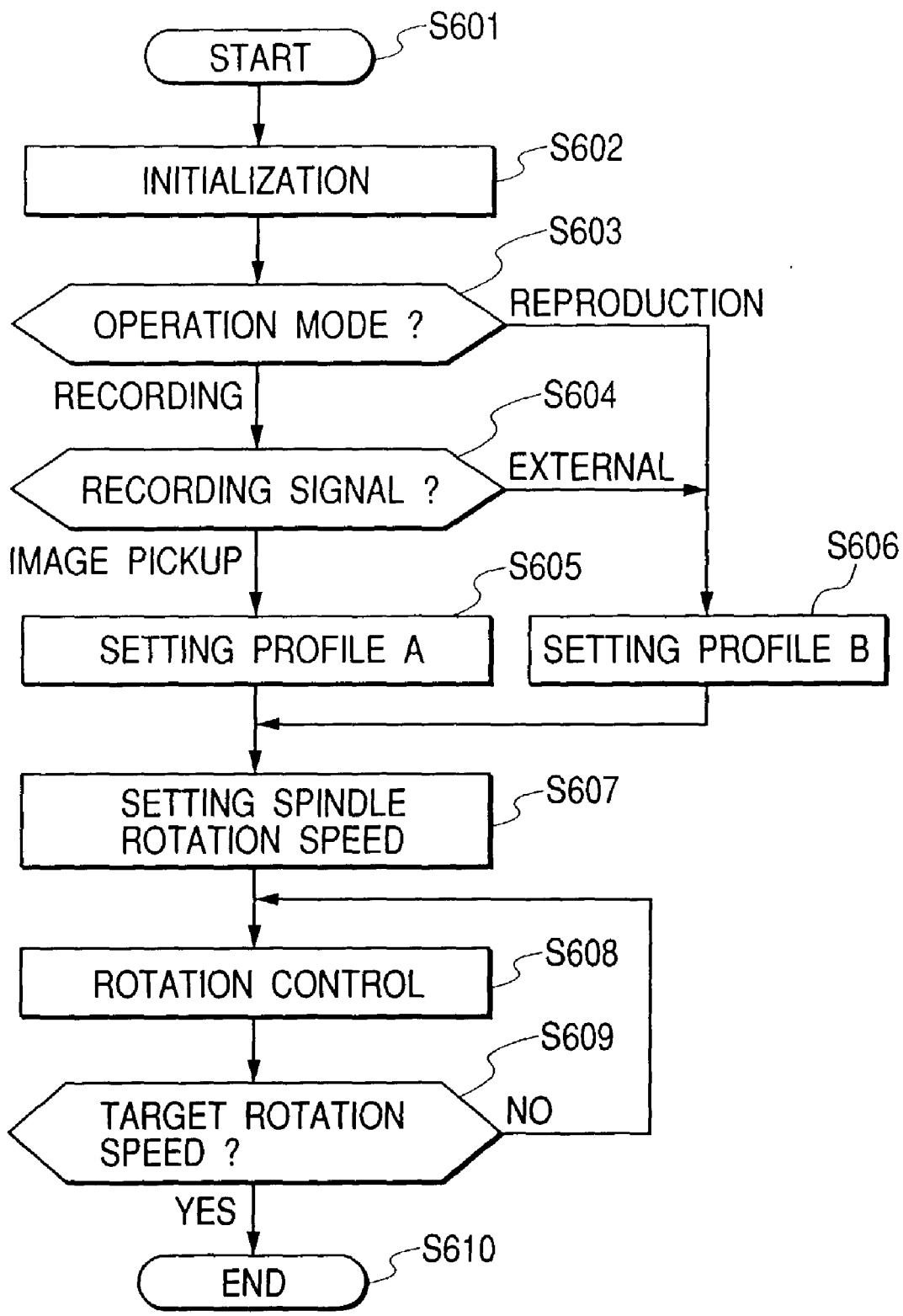
FIG. 11 is a flow chart illustrating the operation of the video camera.

FIG. 11 is a flow chart showing the spindle control process executed by the CPU 103 according to this embodiment.

Steps S601 and S602:

When provided with a spindle operation command (step S601), the target rotation speed of the disk medium 206 is initialized (step S602).

Figure 12:
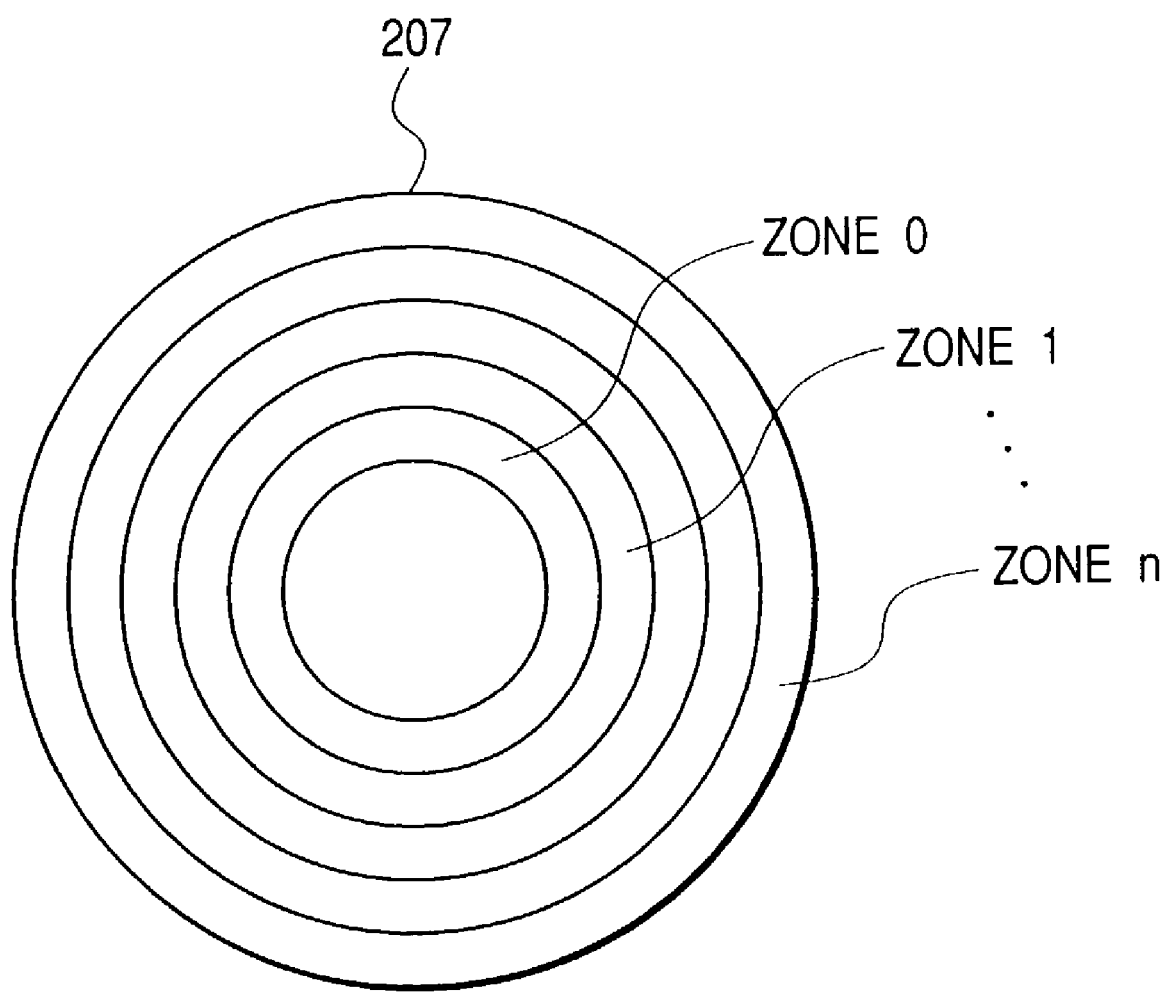
FIG. 12 is a diagram illustrating a recording medium.

The target rotation number is set to the same value within an area of the disk medium 206 which is called a zone 0, 1, . . . , n as shown in FIG. 12, each of which composed of a plurality of tracks. As shown in this figure, the disk medium 206 is partitioned into zones 0, 1, . . . , n in this order from the inner circumference thereof. More inner circumferential zones are controlled to rotate at higher speeds than more outer circumferential zones.

Step S603:

The CPU 103 determines the operation mode.

If it is determined that the operation mode is the recording mode, the process proceeds to step S604. If the operation mode is the reproduction mode, the process proceeds to step S606.

Step S604:

If it is determined at step S603 that the operation mode is the recording mode, the CPU 103 determines whether or not data to be recorded has been obtained using the video camera 100 or supplied by an external source.

If it is determined at step S604 that the data to be recorded is image pickup data obtained using the video camera 100, then the process proceeds to step S605. If the data has been externally input, the process proceeds to step S606.

Step S605:

If it is determined at step S604 that the data to be recorded has been obtained using the video camera 100, the profile selection unit 501 selects and sets the spindle speed profile 502A. After step S605, the process proceeds to step S607.

Step S606:

If it is determined at step S604 that the data to be recorded has been externally input or it is determined at step S603 that the operation mode is the reproduction mode, then the profile selection unit 501 selects and sets the spindle speed profile 502B. After step S606, the process proceeds to step S607.

Steps S607 to S610:

The CPU 103 sets a predetermined rotation speed within each zone as spindle rotation speed settings (step S607), controls the rotation speed of the spindle to the predetermined value (step S608), and checks whether or not the target rotation speed is reached (step S609). If it is determined that the target rotation speed has been reached, the process is ended (step S610).

As described above, in this embodiment, the two different driving control profiles are provided for the spindle motor. If an image signal from the image pickup unit and an audio signal from the built-in microphone are recorded, the profile for continuously driving the spindle motor is selected.

This prevents the occurrence of loud motor noise associated with driving or stoppage of the spindle motor, thereby preventing noise from the spindle motor from mixing into a sound collected through the microphone.

Further, in the mode in which no sounds from the microphone are recorded, such as the mode in which signals from an external source are recorded, or the reproduction mode, the profile for intermittently driving the control of the spindle is set. Accordingly, the disk can be rotated only during a minimum required period, thereby reducing power consumption.

Third Embodiment

In the video camera 100 of this embodiment, the functional arrangements for spindle operations shown in FIG. 9 are used to realize spindle motor control operations shown in FIGS. 13A to 13D.

FIGS. 13A to 13D show diagrams showing how the motor control unit 507 controls the spindle according to this embodiment.

Figure 13:
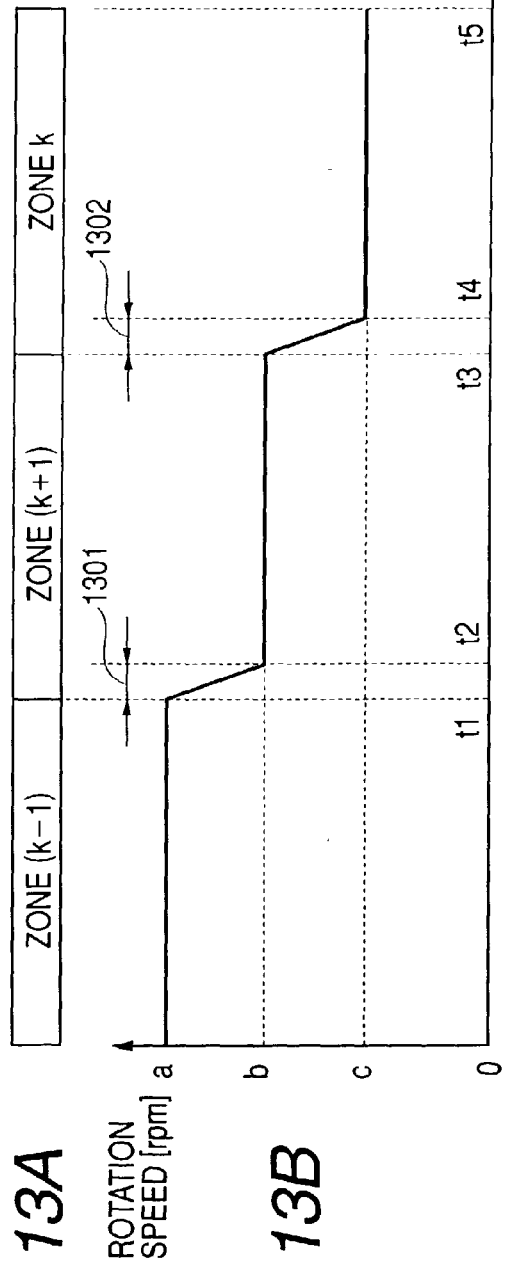
FIGS. 13A, 13B, 13C, and 13D are diagrams illustrating a spindle speed profile.

Specifically, FIG. 13A is a diagram showing zones on the disk medium 206 in which the pickup 303 may be present when rotation of the spindle is controlled according to the spindle control profile 502B. FIG. 13B is a diagram showing how the spindle is controlled according to the spindle speed profile 501B.

In the following description of this embodiment, a ZCLV (Zoned Constant Linear Velocity) method is used in which recording and reproduction are carried out with the rotation speed of the disk per unit time, set at the same value within each zone composed of a plurality of tracks.

For example, it is assumed that the rotation of the spindle is controlled as the optical pickup 303 is sequentially moved from zone (k−1), located at the inner circumferential position, to zone (k+1). Then, according to the spindle speed profile 501B, shown in FIG. 13B, in a time period from t0 to t1, when the pickup 303 is present in the zone (k−1), the rotation speed of the spindle is controlled to attain a value a. Then, if the pickup 303 moves from zone (k−1) to zone k, the rotation speed of the spindle is changed from value a to value b in a period 1301, shown as a time period from t1 to t2. During this period, the pickup 303 remains in the first track of the zone k. Then, once the rotation speed reaches the value b at time t2, the pickup starts to be moved.

Subsequently, in a time period from t2 to t3, when the pickup 303 is present in the zone k, the rotation speed of the spindle is controlled to attain the value b. Then, if the pickup 303 moves from zone k to zone (k+1), the rotation speed of the spindle is changed from value b to value c in a period 1302, shown as a time period from t3 to t4. During this period, the pickup 303 remains in the first track of the zone k+1. Then, once the rotation speed reaches the value c at time t4, the pickup starts to be moved.

Then, in a time period from t4 to t5, when the pickup 303 is present in the zone (k+1), the rotation speed of the spindle is controlled to attain the value c.

Further, FIG. 13C is a diagram showing zones on the disk medium 206 in which the pickup 303 may be present when rotation of the spindle is controlled according to the spindle control profile 502A. FIG. 13D is a diagram showing how the spindle is controlled according to the spindle speed profile 501A.

For example, it is assumed that the rotation of the spindle is controlled while the pickup 303 is sequentially moved from zone (k−1), located at the inner circumferential position, to zone (k+1). Then, according to the spindle speed profile 501B, shown in FIG. 13D, in a time period from t0 to t1, when the pickup 303 is present in the zone (k−1), the rotation speed of the spindle is controlled to attain the value a. Then, if the pickup 303 moves from zone (k−1) to zone k, the rotation speed of the spindle is changed from value a to value b in a period 1303, shown as a time period from t1 to t2'. During this period, the pickup 303 remains in the first track of the zone k. Then, once the rotation speed reaches the value b at time t2', the pickup 303 starts to be moved.

In this embodiment, when the rotation speed of spindle is changed between the zones according to the spindle speed profile 501A, more time is spent before the target rotation speed is accomplished. That is, as shown in FIGS. 13A to 13D, when the pickup 303 moves from zone (k−1) to zone k, the spindle speed profile B causes the rotation speed to be changed from value a to value b in the period 1301 from time t1 to t2. In contrast, the spindle speed profile A causes the rotation speed to be more slowly changed in the period 1303 from time t1 to t2', which is longer than the period from time t1 to t2.

Subsequently, in a time period from t2' to t3', when the pickup 303 is present in the zone k, the rotation speed of the spindle is controlled to attain the value b. Then, if the pickup 303 moves from zone k to zone (k+1), the rotation speed of the spindle is changed from value b to value c in a period 1304, shown as a time period from t3' to t4', which is longer than the period 1302 from t3 to t4, shown in FIG. 13B. During this period, the pickup 303 remains in the first track of the zone k+1. Then, once the rotation speed reaches the value c at time t4', the pickup starts to be moved.

Then, in a time period from t4' to t5', when the pickup 303 is present in the zone (k+1), the rotation speed of the spindle is controlled to attain the value c.

In this manner, the spindle speed profile 501A sets more time to be spent before the target rotation speed is accomplished at the zone boundary than the spindle speed profile 501B. Specifically, for example, the motor control unit 507 in FIG. 9 changes the loop gain of the PLL circuit for setting the rotation speed of the spindle, according to selected spindle speed profile. That is, the loop gain in the spindle speed profile 501A is set to be lower than that in the spindle speed profile 501B so as to increase the time spent before the target rotation speed is accomplished.

Figure 14:
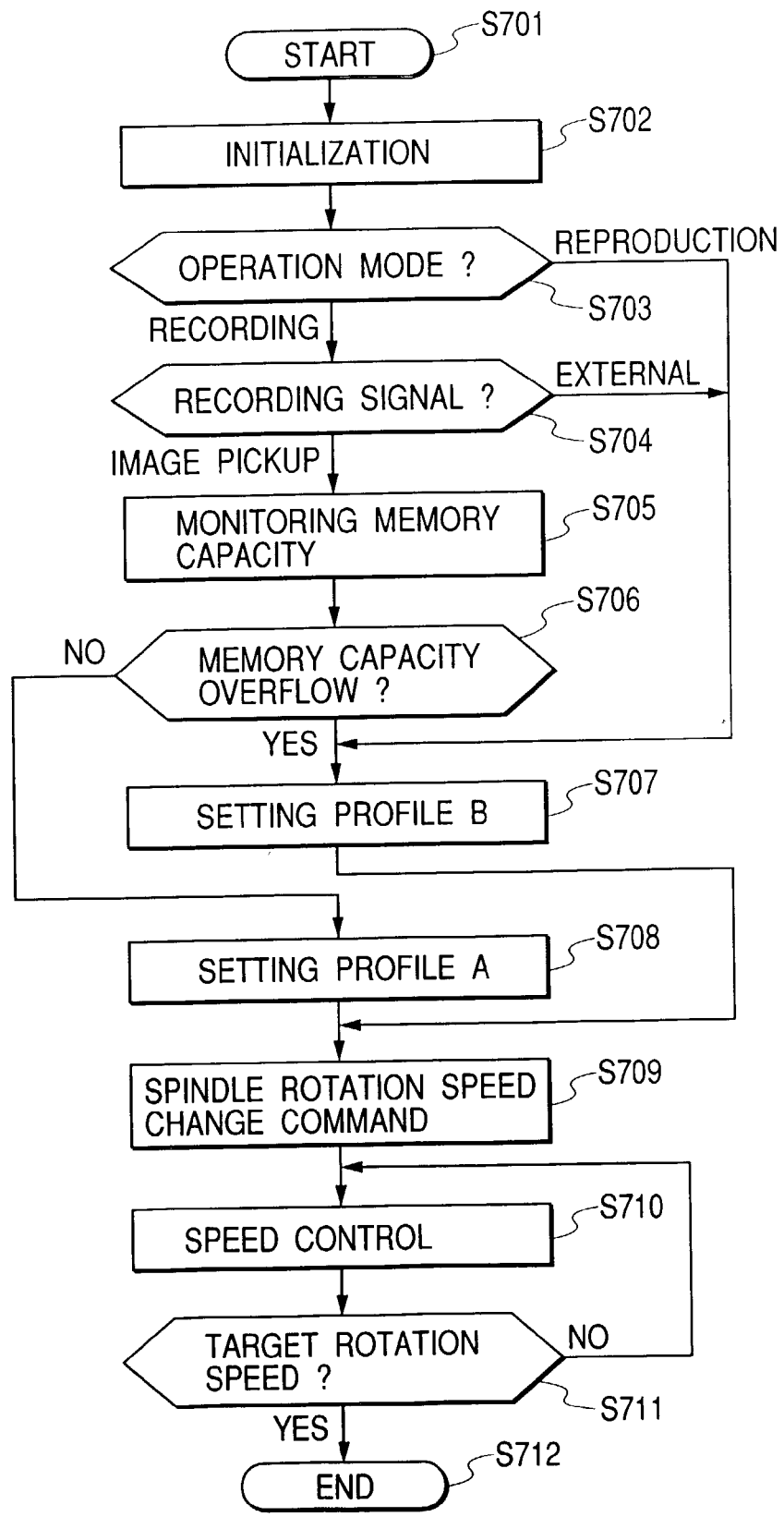
FIG. 14 is a flow chart illustrating the operation of the video camera.

FIG. 14 is a flow chart showing a spindle control operation performed by the CPU 103 according to this embodiment.

Steps S701 and S702:

When provided with a spindle operation command (step S701), the CPU 103 initializes the target rotation speed of the disk medium 206 (step S702). Here, the target rotation speed is the same value set for each region of the disk medium 206 which is called a zone 0, 1, . . . , n composed of a plurality of tracks as shown in FIG. 12.

Step S703:

The CPU 103 determines the operation mode.

If it is determined at step S703 that the operation mode is the recording mode, the process proceeds to step S704. If the operation mode is the reproduction mode, the process proceeds to step S707.

Step S704:

If it is determined at step S703 that the operation mode is the recording mode, the CPU 103 determines whether or not data to be recorded has been obtained using the video camera 100 or has been supplied by an external source.

If it is determined at step S704 that the data to be recorded has been obtained using the video camera 100, then the process proceeds to step S705. If the data to be recorded has been externally input, then the process proceeds to step S707.

Step S705:

If it is determined at step S704 that the data to be recorded has been obtained using the video camera 100, then the memory capacity overflow determination unit 105 monitors the storage capacity of the shock proof memory 104 when the spindle motor changes the rotation speed.

Step S706:

If the memory capacity overflow determination unit 105 determines, by the monitoring operation at step S705, whether or not the shock proof memory 104 is overflowing. If it is determined at step S706 that the shock proof memory 104 is overflowing, then the process proceeds to step S707. Otherwise, the process proceeds to step S709.

Step S707:

If it is determined at step S703 that the operation mode is the reproduction mode or it is determined at step S704 that the data to be recorded has been externally input or it is determined at step S706 that the shock proof memory 104 is overflowing, then the profile selection unit 501 selects and sets the seek speed profile 502B.

After step S707, the process proceeds to step S709.

Step S708:

If it is determined at step S706 that the shock proof memory 104 is not overflowing, i.e. the amount of data stored in the memory is equal to or smaller than the predetermined capacity, the profile selection unit 501 selects and sets the spindle speed profile 502A. The spindle speed profile 502A is a control profile that causes the spindle motor to change the rotation speed more slowly than the spindle speed profile 502B.

After step S708, the process proceeds to step S709.

Steps S709 to S712:

After steps S707 and S708, the CPU 103 issues a spindle speed change instruction to the motor control section 507 (step S709), which then controls rotation of the spindle (step S710). If it is determined that the target rotation speed has been accomplished (step S711), the process is ended (step S712).

Thus, when the rotation speed of the spindle is changed as the pickup moves between the zones, predetermined rotation control is provided according to the set spindle rotation control profile (spindle speed profile). It is then confirmed that the target rotation speed has been reached, and then the process is ended.

As described above, the two different driving control profiles are provided for the spindle motor. If an image signal from the image pickup unit is recorded, the profile is selected which switches the target rotation speed between the zones more slowly.

This prevents the occurrence of loud motor noise resulting from acceleration of the spindle motor associated with switching of the rotation speed between the zones. This in turn prevents noise from the spindle motor from mixing into a sound collected through the microphone.

In the previously described embodiments, the seek control profile or the spindle control profile is switched depending on whether the video camera is in the photographing mode in which image and audio data obtained inside the video camera are recorded, or in the recording or reproduction mode for externally input mode.

However, the control profile may be switched depending on whether the photographing mode is a motion picture photographing mode in which a motion picture is recorded together with an associated sound, or a still image photographing mode in which only still images are recorded.

That is, in recent years, owing to the improved resolution of image pickup elements, video cameras have generally had not only the motion picture photographing mode but also the still image photographing mode, in which high-definition still images are recorded.

In the motion picture photographing mode, a sound associated with an image of an object is generally obtained through the microphone and recorded together with the image. However, in the still image mode, only high-definition still images are generally recorded, whereas no sounds are recorded.

Thus, for example, the video camera 100 comprises the motion picture photographing mode and the still image photographing mode so that a control profile for a seek operation or a spindle rotating operation can be controlled depending on the photographing mode set by a user.

For example, in the first embodiment, in the mode in which data photographed using the video camera 100 is recorded, the seek profile A with a lower seek speed is selected according to a uniform standard as shown in FIG. 5. However, as shown in FIG. 15, the seek profile A is selected in the motion picture photographing mode, whereas the seek profile B is selected in the still image photographing mode.

A seek operation can be promptly performed by thus setting the seek profile B in the still image photographing mode. Accordingly, even if still images are continuously photographed, the still image data can be promptly recorded on the disk.

Then, the still image photographing mode will be simply described with reference to FIG. 1.

When the user I/F 106 sets the still image photographing mode, the CPU 103 displays image data output from the camera signal processing unit 203 on the display unit 213. Then, when the user I/F 106 specifies the still image photographing, the CPU 103 stores one frame of image data currently output by the camera signal processing unit 203 in the memory 211. Then, the compression/expansion processing unit 204 compressively encodes and outputs the one frame of image data to the recording and reproduction processing unit 205. In the still image photographing mode, the data is compressively encoded using a still image encoding method such as JPEG. The recording and reproduction processing unit 205 subjects the one frame of encoded image data to required processes and records it on the disk medium 206 as still image data.

The object of the present invention is accomplished by supplying a system or an apparatus with a storage medium storing program codes of software that implements the functions of a host and a terminal according to the first to third embodiments, and causing a computer (or a CPU or MPU) of the system or apparatus to read and execute the program codes stored in the storage medium.

In this case, the program codes themselves read from the storage medium implement the functions of the first to third embodiments, and the storage medium storing the program codes and the program codes constitute the present invention.

The storage medium for supplying the program codes may be a ROM, a flexible disk, a hard disk, an optical disk, an optical magnetic disk, a CD-ROM, a CD-R, a magnetic tape, a non-volatile memory card, or the like.

Further, the functions of the first to third embodiments may be implemented not only by executing the program codes read by the computer but also by causing an OS or the like operating on a computer to execute a part or all of an actual process on the basis of instructions in the program codes.

Furthermore, the functions of the first to third embodiments are implemented by writing program codes read from a storage medium, into a memory provided in an expanded board inserted into a computer or an expanded unit connected to the computer, and causing a CPU or the like provided in the expanded board or unit to execute a part or all of an actual process on the basis of instructions in the program codes.

Figure 16:
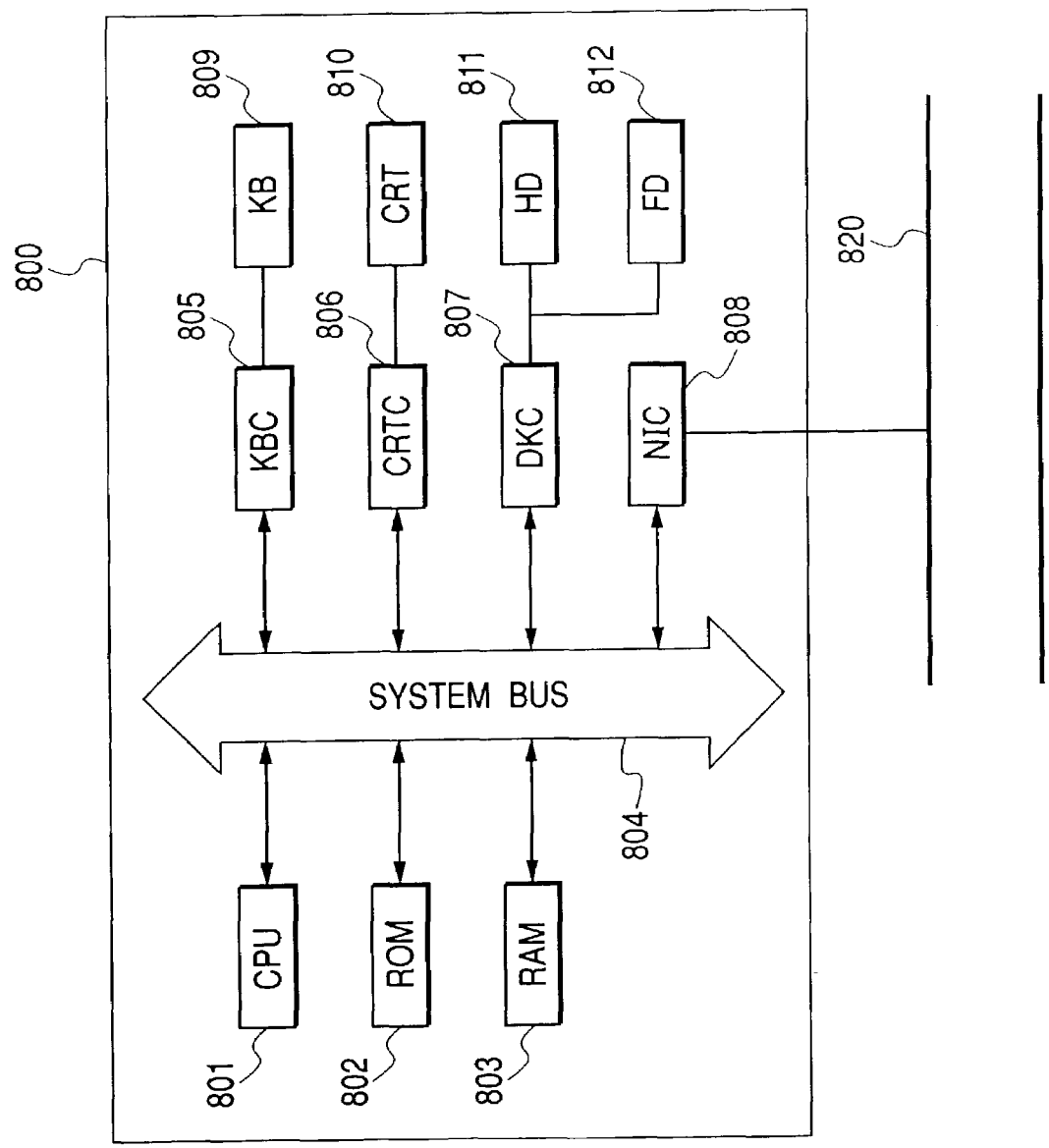
FIG. 16 is a block diagram showing a configuration of a computer that executes functions of the present invention.
Figure 17:
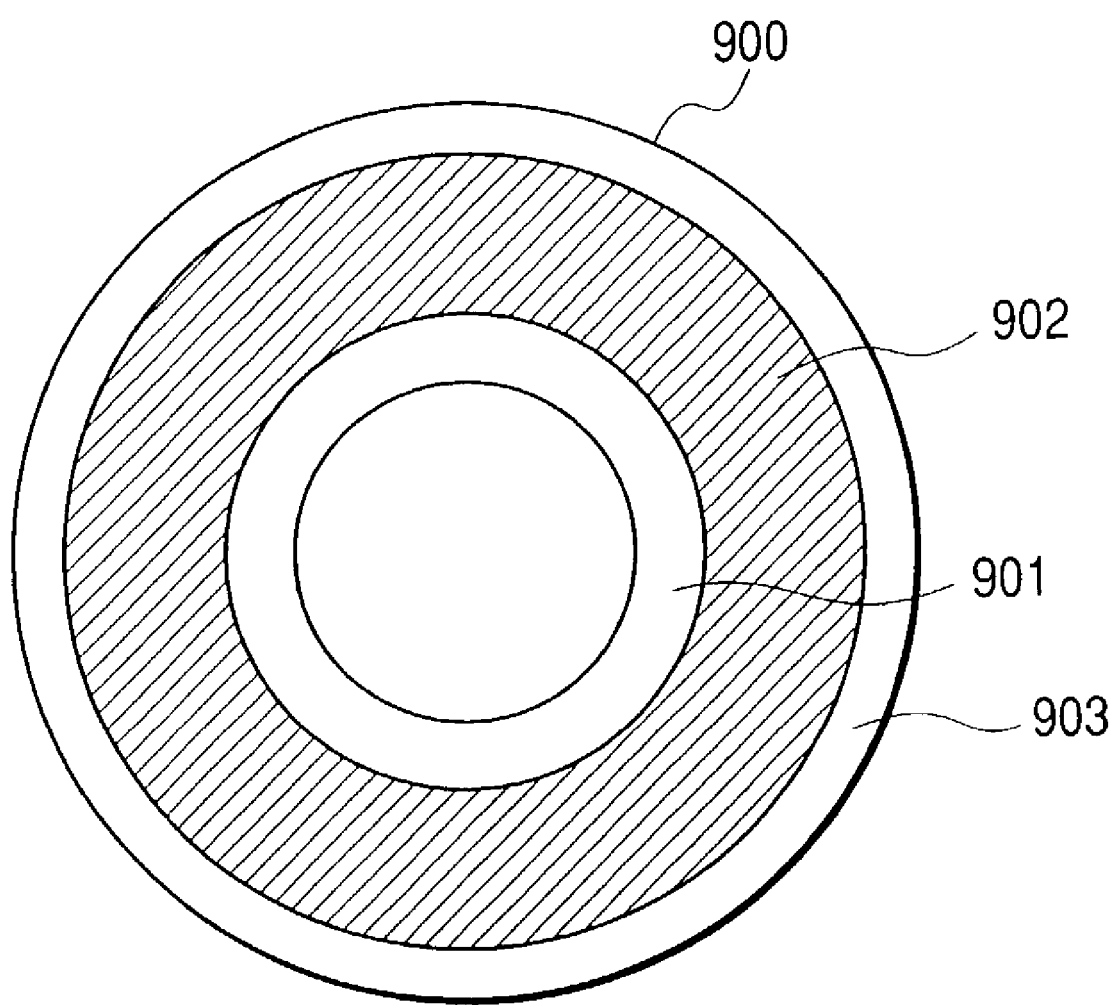
FIG. 17 is a diagram showing a recording operation of a conventional image pickup recording and reproducing apparatus.

FIG. 16 shows a function 600 of the above computer.

As shown in FIG. 16, the computer function 600 is composed of a CPU 801, a ROM 802, a RAM 803, a keyboard controller (KBC) 805 for a keyboard (KB) 809, a CRT controller (CRTC) 806 for a CRT display (CRT) 810 as a display unit, a disk controller (DKC) 807 for a hard disk (HD) 811 and flexible disk (FD) 812, and a network interface controller (NIC) 808 for connections to a network 820, these components being connected together via a system bus 804 so as to communicate with one another.

The CPU 801 unifies and controls the components connected to the system bus 804 by executing software stored in the ROM 802 or HD 811 or software supplied by the FD 812.

That is, the CPU 801 provides such control as implements the operations of the first to third embodiments by reading a process program based on a predetermined process sequence from the ROM 802, HD 811, or FD 812 and executing it.

The RAM 803 functions as a main memory, a work area, or the like of the CPU 801. The KBC 805 controls instructive inputs from the KB 809, a pointing device (not shown), or the like. The CRTC 806 controls display of the CRT 810.

The DKC 807 controls accesses to the HD 811 and FD 812, which stores boot programs, various applications, edition files, user files, network management programs, predetermined programs based on the first to third embodiments, or the like.

The NIC 808 exchanges data to and from an apparatus or system on the network 820.

Many widely different embodiments of the present invention may be constructed without departing from the spirit and scope of the present invention. It should be understood that the present invention is not limited to the specific embodiments described in the specification, except as defined in the appended claims.

What is claimed is:

1. A recording apparatus comprising:
    image pickup means;
    a microphone;
    input means for inputting image data and audio data from an exterior of the apparatus;
    recording means for recording the image data and audio data on a disk-shaped recording medium by recording element, said recording means including a movement mechanism to move the recording element in a radial direction of the disk-shaped recording medium;
    mode setting means for setting one of a plurality of modes including a first recording mode in which said recording means records, on the disk-shaped recording medium, image data obtained by said image pickup means and audio data obtained through said microphone and a second recording mode in which said recording means records, on the disk-shaped recording medium, the image data and audio data obtained by said input means; and
    control means for selecting one of a first control profile for moving the recording element and a second control profile for moving the recording element at a higher speed than the first control profile, according to the mode set by said mode setting means, and controlling the movement mechanism on the basis of said selected control profile, said control means selecting the first control profile if the first recording mode is set by said mode setting means and selecting the second control profile if the second recording is set by said setting means.

2. The recording apparatus according to claim 1, wherein the disk-shaped recording medium includes an optical disk, and said recording element includes an optical pickup.

3. The recording apparatus according to claim 1, further comprising reproduction means for reproducing said image data and audio data from the disk-shaped recording medium,
    wherein said control means further selects said second control profile in response to setting, by said mode setting means, of a reproduction mode in which said reproduction means reproduces said image data and audio data, and said control means controls the movement mechanism to said second control profile.

4. A recording apparatus comprising:
    image pickup means;
    a microphone;
    a memory which stores image data obtained by said image pickup means and audio data obtained through said microphone;
    recording means for reading out image data and audio data stored in said memory and records the read-out data on a disk-shaped recording medium by a recording element, said recording means including a movement mechanism to move the recording element in a radial direction of the disk-shaped recording medium; and
    control means for selecting one of a first control profile for moving the recording element and a second control profile for moving the recording element at a higher speed than the first control profile, on the basis of the amount of said image data and audio data stored in said memory and controlling the movement mechanism on the basis of said selected control profile, said control means selecting said first control profile if the amount of image data and audio data stored in said memory is equal to or smaller than a predetermined value, and said control means selecting said second control profile if the amount of image data audio data stored in said memory exceeds said predetermined value.

5. A recording apparatus comprising:
    a microphone;
    input means for inputting an audio data from an exterior of the apparatus;
    recording means for recording the audio data on a disk-shaped recording medium by a recording element, said recording means including a movement mechanism to move the recording element in a radial direction of the disk-shaped recording medium;
    mode setting means for setting one of a plurality of modes including a first recording mode in which said recording means records, on the disk-shaped recording medium, audio data obtained through said microphone and a second recording mode in which said recording means records, on the disk-shaped recording medium, the audio data obtained by said input means; and
    control means for selecting one of a first control profile for moving the recording element and a second control profile for moving the recording element at a higher speed than the first control profile, according to the mode set by said mode setting means, and controlling the movement mechanism on the basis of said selected control profile, said control means selecting the first control profile if the first recording mode is set by said mode setting means and selecting the second control profile if the second recording mode is set by said mode setting means.

* * * * *